United States Patent
Kai et al.

(10) Patent No.: US 9,214,365 B2
(45) Date of Patent: Dec. 15, 2015

(54) TWO-FLUID NOZZLE AND SUBSTRATE LIQUID PROCESSING APPARATUS AND SUBSTRATE LIQUID PROCESSING METHOD

(75) Inventors: Yoshihiro Kai, Koshi (JP); Satoshi Kaneko, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 756 days.

(21) Appl. No.: 13/529,121

(22) Filed: Jun. 21, 2012

(65) Prior Publication Data
US 2012/0325274 A1 Dec. 27, 2012

(30) Foreign Application Priority Data

Jun. 21, 2011 (JP) ................................ 2011-137696
Nov. 15, 2011 (JP) ................................ 2011-249589

(51) Int. Cl.
*H01L 21/67* (2006.01)

(52) U.S. Cl.
CPC ................................ *H01L 21/67051* (2013.01)

(58) Field of Classification Search
CPC ........................ H01L 21/67051; H01L 21/6708
See application file for complete search history.

(56) References Cited

U.S. PATENT DOCUMENTS

| 5,820,036 A * | 10/1998 | Saito ............................... 239/703 |
| 2004/0261817 A1 * | 12/2004 | Araki et al. ........................ 134/2 |
| 2007/0102841 A1 * | 5/2007 | Bondeson et al. ......... 264/209.1 |
| 2007/0169793 A1 * | 7/2007 | Shimada et al. ................ 134/26 |
| 2009/0026291 A1 * | 1/2009 | Shimada ....................... 239/405 |
| 2009/0165828 A1 | 7/2009 | Sato |

FOREIGN PATENT DOCUMENTS

| JP | 2003-117442 A | | 4/2003 |
| JP | 2004-356317 A | | 12/2004 |
| JP | 2005046737 A | * | 2/2005 |
| JP | 2008-114183 A | | 5/2008 |
| JP | 2008130763 A | * | 6/2008 |
| JP | 2009-088078 A | | 4/2009 |

OTHER PUBLICATIONS

Abstract of JP2008130763A (Kenichi, Jun. 2008).*
Machine English Translation of Description of JP2005046737A (Takayuki et al. Feb. 2005).*

* cited by examiner

*Primary Examiner* — David Cromier
*Assistant Examiner* — Irina Graf
(74) *Attorney, Agent, or Firm* — Pearne & Gordon LLP

(57) ABSTRACT

A two-fluid nozzle 34 for spraying, toward a processing target object, droplets of a processing solution which are formed by mixing the processing solution discharged from a liquid discharge portion 48 and a gas discharged from a gas discharge opening 52 can uniformly spray the droplets of the processing solution having small diameters. Here, the liquid discharge portion 48 includes a multiple number of liquid discharge openings 47 arranged along a circle inside the gas discharge opening 52, and the multiple number of liquid discharge openings 47 discharge the processing solution in an outward direction of the circle.

9 Claims, 3 Drawing Sheets

TWO-FLUID NOZZLE AND SUBSTRATE LIQUID PROCESSING APPARATUS AND SUBSTRATE LIQUID PROCESSING METHOD

CROSS-REFERENCE TO RELATED APPLICATION

This application claims the benefit of Japanese Patent Application Nos. 2011-137696 and 2011-249589 filed on Jun. 21, 2011 and Nov. 15, 2011, respectively, the entire disclosures of which are incorporated herein by reference.

FIELD OF THE INVENTION

The present disclosure relates to a two-fluid nozzle for spraying, toward a processing target object, droplets of a processing solution which are formed by mixing the processing solution discharged from a liquid discharge portion and a gas discharged from a gas discharge opening. The present disclosure also relates to a substrate liquid processing apparatus and a substrate liquid processing method for performing a liquid process on a substrate by using the two-fluid nozzle.

BACKGROUND OF THE INVENTION

Conventionally, when manufacturing a semiconductor device, a flat panel display, or the like, a substrate such as a semiconductor wafer or a liquid crystal substrate is processed with a processing solution such as a cleaning solution.

In a substrate liquid processing apparatus for performing such a liquid process on the substrate, a two-fluid nozzle is used to spray droplets of the processing solution on a surface of the substrate.

The two-fluid nozzle has a circular hole-shaped liquid discharge portion for discharging the processing solution and a circular ring-shaped gas discharge opening for discharging a gas. The liquid discharge portion is formed at a central portion of a lower end portion of the two-fluid nozzle, and the gas discharge opening is formed at an outside of the liquid discharge portion. The two-fluid nozzle discharges a processing solution of a certain flow rate downward from the liquid discharge portion and also discharges a gas of a certain flow rate toward the processing solution from the gas discharge opening inwardly. The processing solution and the gas are mixed at an outside of (under) the two-fluid nozzle. The processing solution is dispersed due to a discharging pressure of the gas, so that the droplets of the processing solution are formed. Then, the droplets of the processing solution in a mist form are sprayed on the substrate (see, for example, Patent Document 1).

Patent Document 1: Japanese Patent Laid-open Publication No. 2004-356317

In the aforementioned conventional two-fluid nozzle, the droplets of the processing solution are formed by dispersing the processing solution discharged in a cylindrical shape from the circular hole-shaped liquid discharge portion at the central portion of the lower end portion of the two-fluid nozzle with the gas discharged from the gas discharge opening at the outside of the liquid discharge portion. However, in such a conventional two-fluid nozzle, the processing solution is not efficiently dispersed. As a result, droplets not having sufficiently small diameters may be formed. Further, the diameters of the formed droplets may become non-uniform. Thus, a liquid processing effect (for example, a cleaning effect) by the droplets of the processing solution may be deteriorated.

BRIEF SUMMARY OF THE INVENTION

In accordance with one aspect of an illustrative embodiment, there is provided a two-fluid nozzle for spraying, toward a processing target object, droplets of a processing solution which are formed by mixing the processing solution discharged from a liquid discharge portion and a gas discharged from a gas discharge opening. In the two-fluid nozzle, the liquid discharge portion may include a multiple number of liquid discharge openings arranged along a circle inside the gas discharge opening. Further, the multiple number of liquid discharge openings may be configured to obliquely discharge the processing solution in an outward direction of the circle.

A distance between adjacent liquid discharge openings among the multiple number of the liquid discharge openings may be set to be a distance allowing processing solutions discharged from the respective liquid discharge openings not to contact with each other.

A distance between each of the liquid discharge openings and the gas discharge opening may be set to be a distance allowing processing solutions discharged from adjacent liquid discharge openings to be mixed with the gas while not being contacted with each other.

A distance between adjacent liquid discharge openings may be equal to or larger than a diameter of the liquid discharge opening.

The gas discharge opening may have a slit shape.

The gas discharge opening may be configured to discharge the gas in a downward direction.

The two-fluid nozzle may further include a vortex flow generating unit configured to discharge the gas from the gas discharge opening while generating a vortex of the gas.

In accordance with another aspect of an illustrative embodiment, there is provided a substrate liquid processing apparatus for performing a liquid process on a substrate by using droplets of a processing solution. The substrate liquid processing apparatus includes a substrate holding unit configured to rotate the substrate while holding the substrate thereon; a cup positioned to surround the substrate held on the substrate holding unit to receive the processing solution therein; and a two-fluid nozzle for discharging the droplets of the processing solution toward the substrate. The two-fluid nozzle may form the droplets of the processing solution by mixing the processing solution discharged from a liquid discharge portion and a gas discharged from a gas discharge opening. Further, the liquid discharge portion may include a multiple number of liquid discharge openings arranged along a circle inside the gas discharge opening, and the multiple number of liquid discharge openings may be configured to obliquely discharge the processing solution in an outward direction of the circle.

A distance between adjacent liquid discharge openings among the multiple number of the liquid discharge openings may be set to be a distance allowing processing solutions discharged from the respective liquid discharge openings not to contact with each other.

A distance between each of the liquid discharge openings and the gas discharge opening may be set to be a distance allowing processing solutions discharged from adjacent liquid discharge openings to be mixed with the gas while not being contacted with each other.

In accordance with still another aspect of the illustrative embodiment, there is provided a substrate liquid processing method for performing a liquid process on a substrate by spraying, toward a processing target object, droplets of a processing solution which are formed by mixing the processing solution discharged from a liquid discharge portion and a gas discharged from a gas discharge opening. Here, the liquid process may be performed by using the two-fluid nozzle as described above.

In accordance with the illustrative embodiment, the processing solution discharged from each liquid discharge opening of the liquid discharge portion in the outward direction of the liquid discharge portion is mixed with the gas discharged from the gas discharge opening. Accordingly, the processing solution discharged from each liquid discharge opening is efficiently dispersed, and the diameters of the droplets of the processing solution can be uniformed. Thus, a liquid processing effect by the droplets of the processing solution can be improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, a two-fluid nozzle, a substrate liquid processing apparatus including the two-fluid nozzle, and a substrate liquid processing method using the two-fluid nozzle in accordance with illustrative embodiments will be described in detail with reference to the accompanying drawings.

Figure 1:
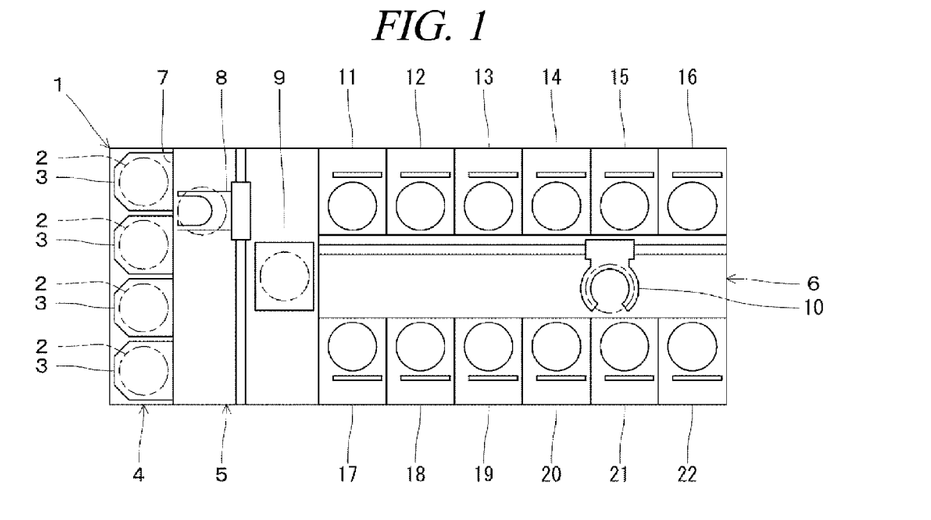
FIG. 1 is a plane view of a substrate liquid processing apparatus.

As depicted in FIG. 1, a substrate liquid processing apparatus 1 includes a substrate loading/unloading section 4; a substrate transfer section 5; and a substrate processing section 6. The substrate loading/unloading section 4 is configured to load and unload a multiple number of, e.g., 25, substrates 2 (herein, semiconductor wafers) as processing target objects to and from a carrier 3 at a front end portion of a substrate liquid processing apparatus 1. Further, the substrate transfer section 5 is arranged at a rear of the substrate loading/unloading section 4 and configured to transfer the substrates 2 accommodated in the carrier 3. Furthermore, the substrate processing section 6 is arranged at the rear of the substrate transfer section 5 and configured to perform various processes, such as a cleaning process and a drying process, on the substrates 2.

The substrate loading/unloading section 4 includes the four carriers 3 at regular intervals in left and right directions while the four carriers 3 are in close contact with a front wall 7 of the substrate transfer section 5.

The substrate transfer section 5 includes a substrate transfer device 8 and a substrate transfer table 9 therein. In the substrate transfer section 5, the substrates 2 are transferred between any one of the carriers 3 placed in the substrate loading/unloading section 4 and the substrate transfer table 9 by using the substrate transfer device 8.

The substrate processing section 6 includes a substrate transfer device 10 at a central portion thereof and substrate processing chambers 11 to 22 arranged back and forth at left and right sides of the substrate transfer device 10.

In the substrate processing section 6, further, each of the substrates 2 is transferred between the substrate transfer table 9 of the substrate transfer section 5 and each of the substrate processing chambers 11 to 22 by using the substrate transfer device 10. Then, each of the substrates 2 is processed in each of the substrate processing chambers 11 to 22.

Figure 2:
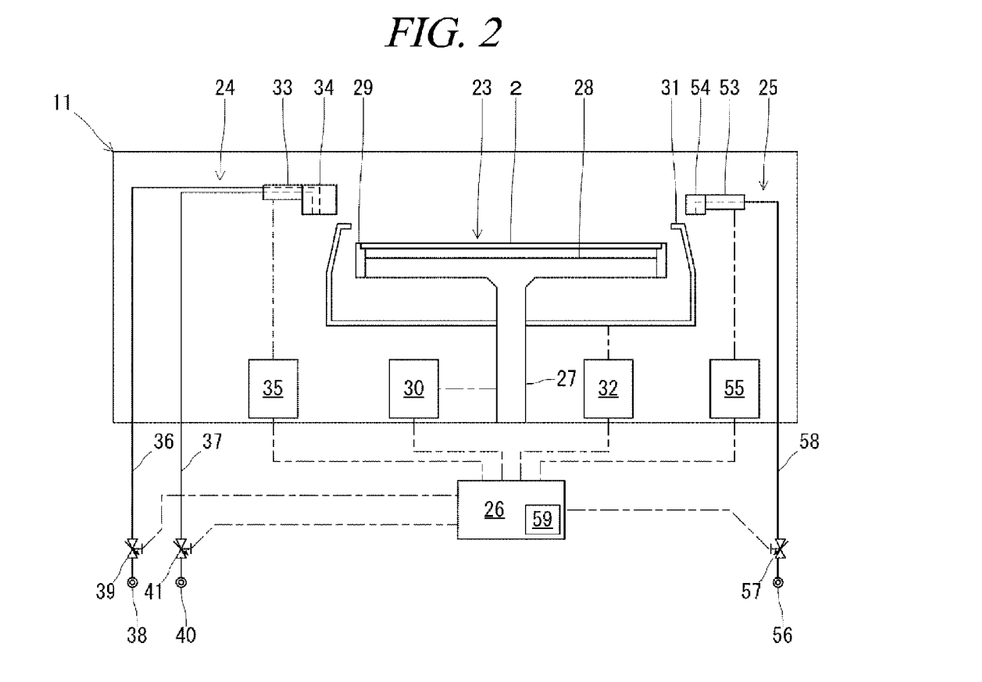
FIG. 2 is a schematic diagram illustrating a substrate processing chamber.

The substrate processing chambers 11 to 22 have the same configuration, and, thus, a configuration of the substrate processing chamber 11 will be explained as a representative example. As depicted in FIG. 2, the substrate processing chamber 11 includes a substrate holding unit 23 configured to horizontally hold and rotate the substrate 2; a processing solution discharge unit 24 configured to discharge a processing solution (herein, a cleaning solution) toward an upper surface of the substrate 2 held on the substrate holding unit 23; and a rinse solution discharge unit 25 configured to discharge a rinse solution toward the upper surface of the substrate 2 held on the substrate holding unit 23. The substrate holding unit 23, the processing solution discharge unit 24, and the rinse solution discharge unit 25 are controlled by a controller 26. Further, the controller 26 controls the whole substrate liquid processing apparatus 1 including the substrate transfer devices 8 and 10.

In the substrate holding unit 23, a circular plate-shaped table 28 is horizontally provided on an upper end portion of a rotation shaft 27, and a multiple number of substrate holding members 29 for horizontally holding the substrate 2 are provided at a periphery of the table 28 at regular intervals along a circumference thereof. The substrate holding members 29 are in contact with a periphery of the substrate 2. The rotation shaft 27 is connected to a rotation driving device 30. The rotation shaft 27 and the table 28 are rotated by the rotation driving device 30, so that the substrate 2 held by the substrate holding members 29 on the table 28 is also rotated. The rotation driving device 30 is connected to the controller 26, and its rotating operation is controlled by the controller 26.

Around the substrate holding unit 23, a cup 31 having an upper opening is provided to be vertically movable. The cup 31 surrounds the substrate 2 mounted on the table 28 to prevent the processing solution or the rinse solution from being dispersed. Further, the cup 31 receives the processing solution or the rinse solution. The cup 31 is connected to an elevating device 32, and the elevating device 32 moves the cup 31 up and down relatively with respect to the substrate 2. The elevating device 32 is connected to the controller 26 and its elevating operation thereof is controlled by the controller 26.

In the processing solution discharge unit 24, an arm is positioned above the table 28 to be horizontally movable, and a two-fluid nozzle 34 serving as a processing solution discharge nozzle is provided at a front end portion of the arm 33. Here, the two-fluid nozzle 34 is configured to mix a processing solution and a gas at the outside of the two-fluid nozzle 34. The arm 33 is connected to a moving device 35. The two-fluid nozzle 34 is horizontally moved between a retreated position above an outside of the substrate 2 and a starting position above a central portion of the substrate 2 by the moving device 35. The moving device 35 is connected to the controller 26, and the moving operation thereof is controlled by the controller 26.

The processing solution discharge unit 24 includes a liquid supply path 36 for supplying the processing solution into the two-fluid nozzle 34; and a gas supply path 37 for supplying the gas into the two-fluid nozzle 34.

The liquid supply path 36 is connected to a liquid supply source 38 for supplying the processing solution (cleaning solution) via a flow rate controller 39. A flow rate of the processing solution to be supplied into the two-fluid nozzle 34 is controlled by the flow rate controller 39. The flow rate controller 39 is connected to the controller 26, and the controller 26 carries out an opening/closing control of the flow rate controller 39 and a flow rate control thereof.

The gas supply path 37 is connected to a gas supply source 40 for supplying a gas (nitrogen gas) via a flow rate controller 41. A flow rate of the gas to be supplied into the two-fluid nozzle 34 is controlled by the flow rate controller 41. The flow rate controller 41 is connected to the controller 26, and the controller 26 carries out an opening/closing control of the flow rate controller 41 and a flow rate control thereof.

Figure 3:
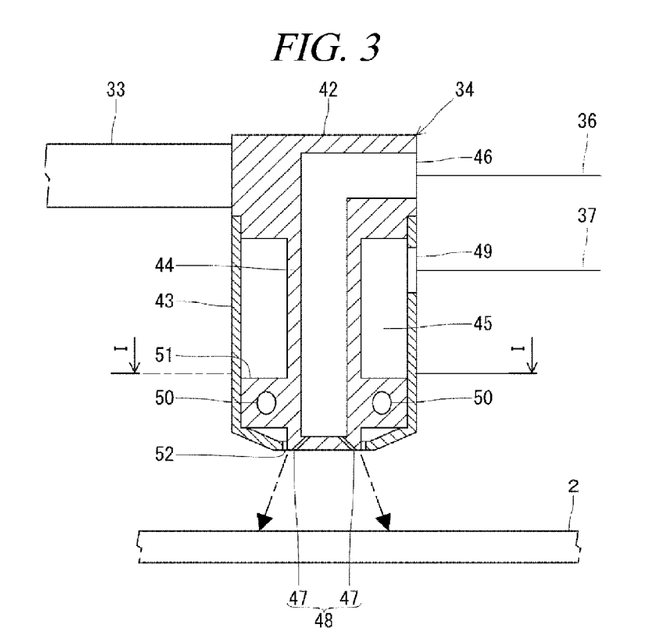
FIG. 3 is a front cross sectional view of a two-fluid nozzle.
Figure 4:
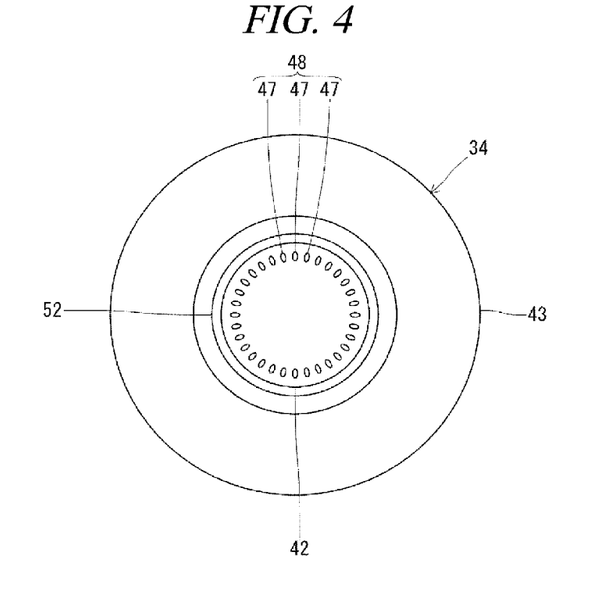
FIG. 4 is an enlarged bottom view of the two-fluid nozzle.
Figure 5:
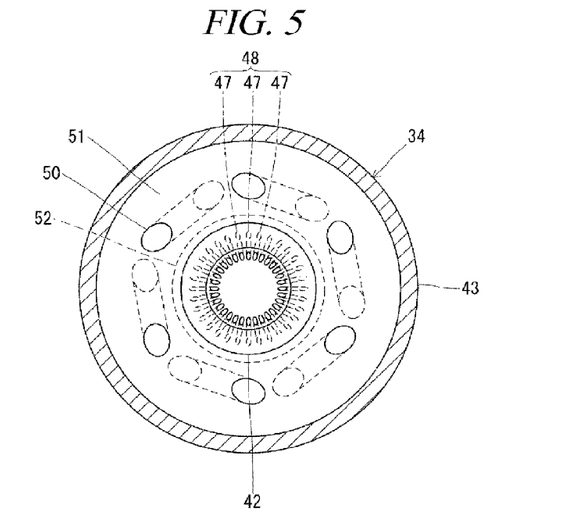
FIG. 5 is a cross sectional view taken along a line I-I of FIG. 3.

Referring to FIGS. 3 to 5, in the two-fluid nozzle 34, a liquid flow path 44 through which the processing solution flows is formed within a nozzle main body 42. A nozzle cover 43 is provided to an outer periphery portion of the nozzle main body 42. A gas flow path 45 through which a gas flows is formed between a recess at the outer periphery portion of the nozzle main body 42 and an inner periphery of the nozzle cover 43.

As for the liquid flow path 44, the liquid supply path 36 is connected to a liquid inlet opening 46 formed at an upper portion of the nozzle main body 42. At a lower end portion of the nozzle main body 42, a multiple number of (for example, thirty two) circular hole-shaped liquid discharge openings 47 are arranged along a circle. These liquid discharge openings 47 are inclined obliquely downward in an outward direction of the circle. A liquid discharge portion 48 for discharging the processing solution includes the multiple number of liquid discharge openings 47. With this configuration, the two-fluid nozzle 34 is capable of discharging the processing solution supplied from the liquid supply path 36 through the respective liquid discharge openings 47 of the liquid discharge portion 48 obliquely downward in the outward direction of the circle in multiple thin stripe shapes. Further, each of the liquid discharge openings 47 is radially formed from a position arranged at an outer periphery portion of the liquid flow path 44 toward a position arranged at an outside of the circle of the liquid flow path 44. The processing solution is discharged and diffused to a region having a range larger than the inner diameter of the liquid flow path 44 in the multiple thin stripe shapes.

As for the gas flow path 45, the gas supply path 37 is connected to a gas inlet opening 49 formed at an upper portion of the nozzle cover 43. In a lower portion of the nozzle main body 42, there is provided a vortex flow generating unit 51 including a multiple number of (here, six) slant holes 50 inclined downward in a clockwise direction when viewed from the top. A gas discharge opening is formed between a leading end portion of the nozzle main body 42 and a leading end portion of the nozzle cover 43. The gas discharge opening 52 is a slit-shaped and circular-ring shaped hole concentric to the liquid discharge portion 48. With this configuration, in the two-fluid nozzle 34, a vortex of the gas supplied from the gas supply path 37 is generated by the vortex flow generating unit 51, and the gas is discharged downward from the gas discharge opening 52. Here, it is desirable to discharge the gas in a direction substantially orthogonal to the substrate 2.

As stated above, the two-fluid nozzle 34 has the liquid discharge portion 48 including the multiple number of liquid discharge openings 47, which are arranged along the circle, for discharging the processing solution obliquely downward in the outward direction of the circle. Such liquid discharge portion 48 is formed at an inside of the gas discharge opening 52 positioned on a concentric circle to the liquid discharge portion 48.

The two-fluid nozzle 34 discharges the processing solution obliquely downward in the outward direction from the multiple number of liquid discharge openings 47 of the liquid discharge portion 48. Further, the two-fluid nozzle discharges the gas downward from the slit-shaped gas discharge opening 52. Accordingly, the processing solution and the gas collide with each other in a region under the liquid discharge portion 48 and the gas discharge opening 52. At this time, the processing solution is dispersed by a discharging pressure of the gas to form droplets of the processing solution in a mist form. The droplets of the processing solution are sprayed on the surface of a substrate 2 as a processing target object. Here, since the processing solution is discharged in the multiple thin stripe shapes, a contact area between the gas and the processing solution becomes larger. As a result, the droplets having small diameters can be uniformly and efficiently formed. Further, since the gas is discharged from the slit-shaped gas discharge opening 52, the gas is allowed to uniformly collide with the processing solution discharged in the stripe shapes. Thus, the uniform droplets can be formed.

In this two-fluid nozzle 34, adjacent liquid discharge openings 47 are arranged apart from each other at a distance equal to or larger than a preset value to prevent processing solutions discharged from the respective liquid discharge openings 47 from being attracted due to a negative pressure and contacted with each other when the processing solution is discharged from the liquid discharge openings 47. The negative pressure may be generated between the processing solutions discharged from the liquid discharge openings 47. To elaborate, a distance between peripheral ends of the adjacent liquid discharge openings 47 is set to be equal to or larger than an opening diameter of each liquid discharge opening 47. With this configuration, the processing solutions discharged in the multiple thin stripe shapes can be prevented from being contacted with each other and merged into a thick cylindrical shape. Accordingly, the droplets having small diameters can be formed uniformly.

Further, in the two-fluid nozzle 34, the liquid discharge openings 47 of the liquid discharge portion 48 and the gas discharge opening 52 are closely located at a distance smaller than a preset value to allow the processing solution discharged from the liquid discharge openings 47 to collide with the gas immediately after being discharged from the liquid discharge openings 47. To elaborate, the liquid discharge openings 47 and the gas discharge opening 52 are arranged with a distance where the processing solutions discharged from the liquid discharge openings 47 collide with the gas while not being contacted with each other. With this configuration, since the processing solution in the multiple thin stripe shapes collide with the gas, the droplets having small diameters can be uniformly formed. If a discharge angle of the processing solution is deviated from a preset value, height at which the processing solution and the gas collide would become non-uniform. However, by allowing the processing solution to collide with the gas immediately after being discharged from the liquid discharge openings 47, non-uniformity in the collision height may be suppressed. In this way, by suppressing the non-uniformity in the state where the processing solution and the gas collide with each other, the uniform droplets can be formed.

The rinse solution discharge unit 25 is provided above the table 28 to horizontally move an arm 53, and a rinse solution discharge nozzle 54 is provided at a front end portion of the arm 53 as depicted in FIG. 2. The arm 53 is connected to a moving device 55, and the rinse solution discharge nozzle 54 is moved between a retreated position above the outside of the substrate 2 and a starting position straightly above the central area of the substrate 2 by the moving device 55. The moving device 55 is connected to the controller 26, and the movement thereof is controlled by the controller 26.

In the rinse solution discharge unit 25, a rinse solution supply source 56 for supplying a rinse solution is connected to the rinse solution discharge nozzle 54 via a flow rate controller 57 and a rinse solution supply path 58. A flow rate of the rinse solution to be supplied to the rinse solution discharge nozzle 54 is controlled by the flow rate controller 57. The flow rate controller 57 is connected to the controller 26, and the controller 26 carries out an opening/closing control and a flow rate control.

The substrate liquid processing apparatus 1 is configured as described above, and processes the substrate 2 in each of the substrate processing chambers 11 to 22 according to a substrate liquid processing program stored in a storage medium 59 which can be read out by the controller (computer). Further, the storage medium 59 may store various programs such as a substrate liquid processing program, and may include a semiconductor memory-type storage medium, such as a ROM or a RAM, or a disk-type storage medium, such as a hard disk or a CD-ROM.

Now, a substrate processing method carried out by the substrate liquid processing program will be discussed. First, the substrate 2 is taken out of the carrier 3 and transferred onto the substrate transfer table 9 by the substrate transfer device 8. The substrate 2 transferred onto the substrate transfer table 9 is loaded into each of the substrate processing chambers 11 to 22 by the substrate transfer device 10 accommodated within the substrate processing section 6. The substrate 2 is then held on the substrate holding members 29. In each of the substrate processing chambers 11 to 22, by driving the rotation driving device 30 under the control of the controller 26, the substrate 2 held on the table 28 and the substrate holding members 29 of the substrate holding unit 23 is rotated at a certain rotation speed. Then, the arm 33 is horizontally moved so that the two-fluid nozzle 34 is located above the central portion of the substrate 2. Thereafter, by opening the flow rate controllers 39 and 41 and adjusting flow rates of the processing solution and gas under the control of the controller 26, the processing solution supplied from the liquid supply source 38 and the gas supplied from the gas supply source 40 are discharged on a top surface of the substrate 2 through the liquid discharge portion 48 and the gas discharge opening 52 of the two-fluid nozzle 34.

The processing solution discharged from the liquid discharge portion 48 and the gas discharged from the gas discharge opening 52 are mixed under the leading end portion of the two-fluid nozzle 34, and the droplets of the processing solution are formed in the mist form. Then, the droplets of the processing solution are sprayed on the substrate 2.

Afterward, according to the substrate liquid processing program, by driving the moving device 35 under the control of the controller 26, the arm 33 is moved back and forth horizontally. Accordingly, the two-fluid nozzle is moved back and forth between the position above the central portion of the substrate 2 and a position above the edge portion of the substrate 2, and the entire surface of the substrate 2 is liquid-processed. Thereafter, the flow rate controllers 39 and 41 are closed by the controller 26, and the discharge of the processing solution and the gas from the two-fluid nozzle 34 is stopped. Then, by driving the moving device 35 under the control of the controller 26, the two-fluid nozzle 34 is moved to the retreated position above the outside of the substrate 2.

Upon the completion of the process by the two-fluid nozzle 34, by driving the moving device 55 under the control of the controller 26, the arm 53 is moved horizontally to locate the rinse solution discharge nozzle 54 at a position above the central portion of the substrate 2. Then, the rinse solution supplied from the rinse solution supply source 56 is discharged toward the top surface of the substrate 2. While the rinse solution is being discharged, the arm 53 is moved from the position above the central portion of the substrate 2 toward the position above the edge portion of the substrate 2. Accordingly, the rinsing process can be performed on the entire surface of the substrate 2. After the rinse solution discharge nozzle 54 is moved to the position above the outside of the substrate 2, the discharge of the rinse solution is stopped. Thereafter, by spinning the substrate 2, a drying process is performed.

Upon the completion of the drying process, the substrate 2 is unloaded from the substrate processing chambers 11 to 22 by the substrate transfer device 10 and is transferred back into the carrier 3 in the reverse sequence as it is loaded.

In this way, the entire surface of the substrate 2 can be liquid-processed by the droplets of the processing solution. If the processing solutions discharged from the adjacent liquid discharge openings 47 are contacted with each other and merged to have the cylindrical shape, it would become impossible to uniformly form the droplets of the processing solution having sufficiently small diameters. For this reason, by discharging the processing solution and the gas at flow rates and flow velocities capable of preventing the contact between the processing solutions discharged from the adjacent liquid discharge openings 47, the droplets of the processing solution can be formed uniformly while having sufficiently small diameters. Further, in accordance with the present illustrative embodiment, the processing solution discharged from the two-fluid nozzle 34 may be pure water of a room temperature or pure water in a heated state. The temperature of the pure water is set not to exceed a saturated vapor pressure based on a relationship between temperature and moisture within the substrate processing chamber. Further, the processing solution is not limited to the pure water, but a chemical liquid may be used, for example.

As stated above, in the two-fluid nozzle 34 and the substrate liquid processing apparatus 1 and the substrate liquid processing method using the two-fluid nozzle 34, the multiple number of liquid discharge openings 47 serving as the liquid discharge portion 48 of the two-fluid nozzle 34 are arranged along the circle at the inside of the gas discharge opening 52. The liquid discharge openings 47 discharge the processing solution obliquely downward in the outward direction of the circle. The processing solution discharged from each liquid discharge opening 47 of the liquid discharge portion 48 obliquely downward in the outward direction of the circle is mixed with the gas discharged downward from the gas discharge opening 52.

Since the processing solution is discharged in the multiple thin stripe shapes, the contact area between the gas and the processing solution becomes larger. Thus, the droplets of the processing solution having small diameters can be formed uniformly and efficiently, and, therefore, the liquid processing effect by the droplets of the processing solution can be improved. Further, since the processing solution is discharged from the multiple liquid discharge openings 47 arranged along the circle, the droplets of the processing solution can be diffused more efficiently, as compared to the conventional two-fluid nozzle that discharges a processing solution in the cylindrical shape from a liquid discharge opening at the central portion of a lower end portion thereof. As the droplets are efficiently diffused, the liquid process can be performed on a wider range of the substrate, so that processing efficiency can be improved.

Moreover, since the gas is discharged from the slit-shaped gas discharge opening 52, the gas is allowed to uniformly collide with the processing solution discharged in the stripe shapes. Hence, the uniform droplets can be formed.

In addition, in this two-fluid nozzle 34, adjacent liquid discharge openings 47 are arranged apart from each other at the distance equal to or larger than the preset value to prevent the processing solutions discharged from the respective liquid discharge openings 47 from being attracted due to the negative pressure and contacted with each other when the processing solution is discharged from the liquid discharge openings 47. The negative pressure may be generated between the processing solutions discharged from the liquid discharge openings 47. With this configuration, the processing solutions discharged in the multiple thin stripe shapes can be prevented from being contacted with each other and merged into the thick cylindrical shape. Accordingly, the droplets having small diameters can be formed uniformly.

Further, the liquid discharge openings 47 of the liquid discharge portion 48 and the gas discharge opening 52 are closely located at the distance smaller than a preset value to allow the processing solution discharged from the liquid discharge openings 47 to collide with the gas immediately after being discharged from the liquid discharge openings 47. With this configuration, since the processing solution of the multiple thin stripe shapes collides with the gas, the droplets having small diameters can be uniformly formed. Further, by allowing the processing solution to collide with the gas immediately after being discharged from the liquid discharge openings 47, non-uniformity in the collision height can be suppressed. Thus, non-uniformity can be suppressed in the state where the processing solution and the gas collide with each other, and the uniform droplets can be formed.

Figure 6:
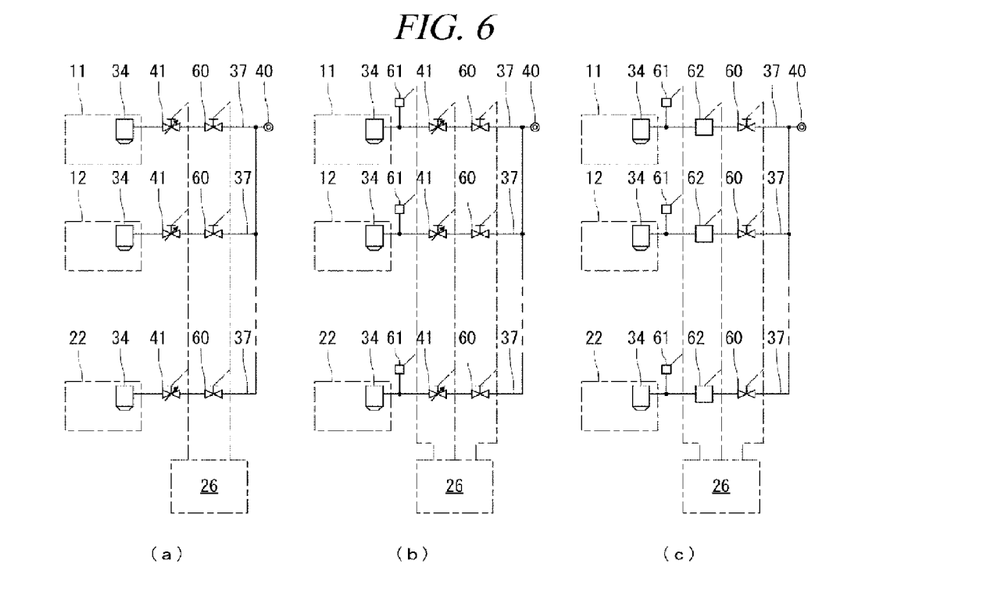
FIG. 6 illustrates diagrams for describing a gas supply path.

In the above-described substrate liquid processing apparatus 1, as shown in FIG. 6(a), the gas is supplied from the single gas supply source 40 into two-fluid nozzles 34 of all the substrate processing chambers 11 to 22. That is, in the substrate liquid processing apparatus 1, a multiple number of (here, twelve) gas supply paths 37 are connected to the gas supply source 40 in parallel, and the two-fluid nozzles 34 of the substrate processing chambers 11 to 22 are connected to the gas supply paths 37, respectively. Further, in the substrate liquid processing apparatus 1, the flow rate controller 41 and the opening/closing valve 60 are provided on each gas supply path 37, and the flow rate controller 41 and the opening/ closing valve 60 are connected to the controller 26. Further, in the substrate liquid processing apparatus 1, by adjusting the flow rate controller 41 under the control of the controller 26, the flow rate of the gas to be supplied into the two-fluid nozzle 34 from the gas supply path 37 can be maintained constant.

The way to control the gas supplied into the two-fluid nozzle 34 from the gas supply path 37 may not be limited to controlling the flow rate of the gas to be constant. By way of example, it may be also possible to perform the control of the gas such that a discharging pressure of the gas supplied into the two-fluid nozzle 34 is maintained constant.

By way of non-limiting example, as illustrated in FIG. 6(b), the opening/closing valve 60, the flow rate controller 41, and a pressure sensor 61 are provided on each gas supply path 37 in this sequence from the upstream side. The opening/ closing valve 60, the flow rate controller 41, and the pressure sensor 61 are connected to the controller 26. The flow rate controller 41 is controlled such that a gas pressure detected by the pressure sensor 61 reaches a predetermined pressure. Alternatively, as depicted in FIG. 6(c), the opening/closing valve 60, an electro-pneumatic valve 62, and the pressure sensor 61 may be provided on each gas supply path 37 in this sequence from the upstream side. The opening/closing valve 60, the electro-pneumatic valve 62, and the pressure sensor 61 are connected to the controller 26. The electro-pneumatic valve 62 is controlled such that the gas pressure detected by the pressure sensor 61 reaches a predetermined pressure. Further, the pressure sensor 61 and the electro-pneumatic valve 62 may be directly connected to each other, and the electro-pneumatic valve 62 may be driven such that the gas pressure detected by the pressure sensor 61 becomes the certain pressure.

As stated above, the gas supplied into the two-fluid nozzle 34 from the gas supply path 37 may be controlled by either a flow rate control or a pressure control. However, the flow velocity is inversely proportional to a cross sectional area (opening area) even when the flow rate is controlled to be constant. Therefore, if the cross sectional area of the gas discharge opening 52 of the two-fluid nozzle 34 is not uniform, the flow velocity of the actually discharged gas may become greatly non-uniform. Meanwhile, the flow velocity is proportional to a pressure if the pressure is controlled to be constant. Therefore, the flow velocity can be controlled to be constant even if the cross sectional area (opening area) of the gas discharge opening 52 of the two-fluid nozzle 34 is not uniform. For this reason, in order to satisfy requirements for discharging the gas from the two-fluid nozzle 34, it is desirable to supply the gas under the pressure control. Especially, when the plural two-fluid nozzles 34 are connected in parallel, the cross sectional areas of the gas discharge openings 52 of the two two-fluid nozzles 34 may not be uniform. In consideration of such a case, it is desirable to carry out the pressure control. In this case, the gas pressures detected by pressure sensors 61 at the respective gas supply paths 37 need to be controlled to become a predetermined pressure.

When supplying the gas into the two-fluid nozzle 34 under the pressure control, a pressure range that is higher than a pressure allowing particles from being efficiently removed from the surface of the substrate 2 and that is lower than a pressure causing damage on a pattern on the surface of the substrate 2 is calculated in advance. The gas is supplied into the two-fluid nozzle 34 within this calculated pressure range. In particular, when the multiple two-fluid nozzles 34 are connected in parallel, discharging pressures of all the two-fluid nozzles 34 are set to be within this calculated pressure range. Further, it is desirable to reduce a pressure loss in each gas supply path 37 between the pressure sensor 61 and the two-fluid nozzle 34. Furthermore, it is desirable to control the pressure loss between the pressure sensor 61 and the two-fluid nozzle to be constant in the respective gas supply paths 37 arranged in parallel. Moreover, it is desirable to set a distance between the pressure sensor 61 and the two-fluid nozzle 34 to be regular in the respective gas supply paths arranged in parallel. With this configuration, the pressure loss between the pressure sensor 61 and the two-fluid nozzle 34 can be controlled to be constant in the respective gas supply paths 37 arranged in parallel. Thus, the discharging pressure of the gas supplied into the two-fluid nozzle 34 can be efficiently maintained constant. Further, the liquid may also be supplied into the two-fluid nozzle 34 under a pressure control.

What is claimed is:
1. A two-fluid nozzle for spraying, toward a processing target object, droplets of a processing solution which are formed by mixing the processing solution discharged from a liquid discharge portion and a gas discharged from a ring-shaped gas discharge opening formed on a lower surface of the two-fluid nozzle, wherein the liquid discharge portion includes a plurality of spaced liquid discharge openings arranged along a circle inside the ring-shaped gas discharge opening, the plurality of spaced liquid discharge openings are inclined relative to the lower surface and are fluidly coupled to a liquid inlet opening, each of the plurality of spaced liquid discharge openings being configured to obliquely discharge the processing solution in an outward direction toward the ring-shaped gas discharge opening, a distance between adjacent liquid discharge openings among the plurality of the liquid discharge openings is set to be a distance allowing processing solutions discharged from the respective liquid discharge openings not to contact each other in a region under the liquid discharge portion until the processing solution discharged from the respective liquid discharge openings collide with the gas, a distance between each of the liquid discharge openings and the ring-shaped gas discharge opening is set to be a distance allowing processing solutions discharged from adjacent liquid discharge openings to be mixed with the gas while not being contacted with each other, the ring-shaped gas discharge opening is configured to discharge the gas in a downward direction, and the liquid discharge openings and the ring-shaped gas discharge opening are positioned on the lower surface of the two-fluid nozzle facing the processing target object, such that the droplets of the processing solution are formed outside of the two-fluid nozzle.

2. The two-fluid nozzle of claim 1, wherein the distance between the adjacent liquid discharge openings is equal to or larger than a diameter of one of the liquid discharge openings.

3. The two-fluid nozzle of claim 1,
wherein the ring-shaped gas discharge opening has a slit shape.

4. The two-fluid nozzle of claim 1, further comprising:
a vortex flow generating portion configured to generate a vortex of the gas, which is discharged from the ring-shaped gas discharge opening.

5. A substrate liquid processing apparatus for performing a liquid process on a substrate by using droplets of a processing solution, the substrate liquid processing apparatus comprising:

a substrate holding unit configured to rotate the substrate while holding the substrate thereon;

a cup positioned to surround the substrate held on the substrate holding unit to receive the processing solution therein; and a two-fluid nozzle for discharging the droplets of the processing solution toward the substrate, wherein the two-fluid nozzle forms the droplets of the processing solution by mixing the processing solution discharged from a liquid discharge portion and a gas discharged from a ring-shaped gas discharge opening formed on a lower surface of the two-fluid nozzle, the liquid discharge portion includes a plurality of spaced liquid discharge openings arranged along a circle inside the ring-shaped gas discharge opening, the plurality of spaced liquid discharge openings are inclined relative to the lower surface and are fluidly coupled to a liquid inlet opening, each of the plurality of spaced liquid discharge openings being configured to obliquely discharge the processing solution in an outward direction toward the ring-shaped gas discharge opening, a distance between adjacent liquid discharge openings among the plurality of the liquid discharge openings is set to be a distance allowing processing solutions discharged from the respective liquid discharge openings not to contact with each other in a region under the liquid discharge portion until the processing solution discharged from the respective liquid discharge openings collide with the gas, a distance between each of the liquid discharge openings and the ring-shaped gas discharge opening is set to be a distance allowing processing solutions discharged from adjacent liquid discharge openings to be mixed with the gas while not being contacted with each other, the ring-shaped gas discharge opening is configured to discharge the gas in a downward direction, and the liquid discharge openings and the ring-shaped gas discharge opening are positioned on the lower surface of the two-fluid nozzle facing the substrate, such that the droplets of the processing solution are formed outside of the two-fluid nozzle.

6. The two-fluid nozzle of claim 5, wherein the distance between the adjacent liquid discharge openings is equal to or larger than a diameter of one of the liquid discharge openings.

7. The substrate liquid processing apparatus of claim 5,
wherein the ring-shaped gas discharge opening has a slit shape.

8. The substrate liquid processing apparatus of claim 5, further comprising:
a vortex flow generating portion configured to generate a vortex of the gas, which is discharged from the ring-shaped gas discharge opening.

9. A substrate liquid processing method for performing a liquid process on a substrate by spraying, toward a processing target object, droplets of a processing solution which are formed by mixing the processing solution discharged from a liquid discharge portion and a gas discharged from a ring-shaped gas discharge opening, wherein the liquid process is performed by using a two-fluid nozzle as claimed in claim 1.

* * * * *

UNITED STATES PATENT AND TRADEMARK OFFICE
CERTIFICATE OF CORRECTION

PATENT NO. : 9,214,365 B2  Page 1 of 1
APPLICATION NO. : 13/529121
DATED : December 15, 2015
INVENTOR(S) : Yoshihiro Kai et al.

It is certified that error appears in the above-identified patent and that said Letters Patent is hereby corrected as shown below:

In the Specification,

Column 4, line 48, please insert -- 33 -- between "arm" and "is".

Column 6, line 4, please insert -- 34 -- between "nozzle" and "discharges".

Column 7, line 17, please insert -- 26 -- between "controller" and "(computer)".

Column 7, line 55, please insert -- 34 -- between "nozzle" and "is".

Column 10, line 49, please insert -- 34 -- between "nozzle" and "to".

Column 10, line 52, please insert -- 37 -- between "paths" and "arranged".

Signed and Sealed this
Twelfth Day of April, 2016

Michelle K. Lee
*Director of the United States Patent and Trademark Office*